United States Patent
Bonora et al.

(10) Patent No.: US 7,784,606 B2
(45) Date of Patent: Aug. 31, 2010

(54) BELT CONVEYOR TRANSPORTING CONTAINERS USED IN SEMICONDUCTOR FABRICATION

(75) Inventors: Anthony C. Bonora, Portola Valley, CA (US); Michael Krolak, Los Gatos, CA (US); Roger G. Hine, Menlo Park, CA (US)

(73) Assignee: Muratec Automation Co., Ltd., Kyoto (JP)

( * ) Notice: Subject to any disclaimer, the term of this patent is extended or adjusted under 35 U.S.C. 154(b) by 0 days.

(21) Appl. No.: 12/331,395

(22) Filed: Dec. 9, 2008

(65) Prior Publication Data

US 2010/0051422 A1 Mar. 4, 2010

(51) Int. Cl.
*B65G 15/00* (2006.01)
(52) U.S. Cl. .................................. 198/817; 198/343.2
(58) Field of Classification Search .............. 198/817, 198/846, 847, 343.2
See application file for complete search history.

(56) References Cited

U.S. PATENT DOCUMENTS

| | | | |
|---|---|---|---|
| 4,823,940 A | | 4/1989 | Cretser |
| 4,823,942 A | * | 4/1989 | Martin et al. ............... 198/847 |
| 4,889,070 A | * | 12/1989 | Sari ........................... 198/817 |
| 5,067,608 A | * | 11/1991 | McLellan .................... 198/817 |
| 5,164,241 A | * | 11/1992 | Andre De La Porte et al. ... 198/847 |
| 5,259,495 A | | 11/1993 | Douglas |
| 5,348,033 A | | 9/1994 | Levit |
| 6,032,788 A | | 3/2000 | Smithers et al. |
| 6,142,293 A | * | 11/2000 | Ozawa et al. ............... 198/817 |
| 6,223,886 B1 | | 5/2001 | Bonora et al. |
| 6,308,818 B1 | | 10/2001 | Bonora et al. |
| 6,435,330 B1 | * | 8/2002 | Bonora et al. ............ 198/346.3 |
| 6,468,021 B1 | | 10/2002 | Bonora et al. |
| 6,494,308 B2 | | 12/2002 | Bonora et al. |
| 6,533,101 B2 | | 3/2003 | Bonora et al. |
| 6,853,876 B2 | | 2/2005 | Wehrung et al. |
| 7,472,788 B2 | * | 1/2009 | Bonora et al. ............... 198/817 |
| 2004/0238332 A1 | | 12/2004 | Brixius et al. |

FOREIGN PATENT DOCUMENTS

| | | |
|---|---|---|
| DE | 100 32 188 A1 | 1/2002 |
| EP | 0 449 706 A1 | 10/1991 |
| EP | 0 939 041 A1 | 9/1999 |

OTHER PUBLICATIONS

Office Action from U.S. Appl. No. 11/484,218 (US patent 7,472,788) dated Mar. 17, 2008.

* cited by examiner

*Primary Examiner*—James R Bidwell
(74) *Attorney, Agent, or Firm*—Fish & Richardson P.C.

(57) ABSTRACT

A conveyor and conveyor system is defined for moving a container used to hold semiconductor wafers. The conveyor includes a first belt having a first support surface for movably supporting the container and a second belt having a second support surface for movably supporting the container. The first belt and the second belt each have a raised guide. The conveyor further includes a drive assembly for moving at least the first belt and causing the container to move over the first and second belts when placed on the first and second support surfaces. Methods for making the conveyor and operating the conveyor are also defined herein.

16 Claims, 11 Drawing Sheets

BELT CONVEYOR TRANSPORTING CONTAINERS USED IN SEMICONDUCTOR FABRICATION

CLAIM OF PRIORITY

This Application claims priority under 35 USC 120 to parent application Ser. No. 11/484,218, entitled "Belt Conveyor for Use with Semiconductor Containers", and filed on Jul. 10, 2006, and is herein incorporated by reference. The parent application, in turn, claims priority under 35 U.S.C.§119(e) to U.S. Provisional Patent Application No. 60/698,124, entitled "Belt Conveyor for use with Semiconductor Conveyors," which was filed with the U.S. Patent & Trademark Office on Jul. 11, 2005, and which is incorporated in its entirely by reference herein.

FIELD OF THE INVENTION

The present invention generally comprises a conveyor system. More specifically, the present invention comprises a belt conveyor system for moving semiconductor containers through a fabrication facility.

BACKGROUND OF THE INVENTION

There are several ways that semiconductor wafer containers are transported in a semiconductor fabrication facility ("fab"). A system for transporting a container is often referred to as an Automated Material Transport System ("AMHS") or simply as a material transport system. A material transport system may refer to a part or all of the overall system. A fab may use only one type of AMHS throughout the fab, or there may be different types of AMHS in certain areas, or different types of AMHS for different transportation functions. Some of these AMHS types use vehicles to hold the container as it is being transported, such as a rail guided vehicle (RGV) or an automated guided vehicle (AGV). Material transport systems utilizing RGVs or AGVs require managing empty vehicles to arrange their arrival at sites where containers are to be picked up. Waiting for the arrival of such vehicles causes AMHS delays and the management of the vehicle movement increases the complexity of the AMHS. The same issues exist when moving containers with an Overhead Hoist Transport (OHT) system.

Conveyor systems are more efficient at moving containers within a fab without any, or a minimum number of, vehicle delays, and do not have to manage empty vehicles. Conveyors directly move the containers without any material or mechanical interface that comes between the conveyor surfaces and the container surfaces. Unless the conveyor is full, it is capable of immediately receiving a container for transport. For these, and other, reasons, conveyors may provide a very high throughput AMHS.

One example of a conveyor system is disclosed in U.S. Pat. No. 6,223,886, entitled "Integrated Roller Transport Pod and Asynchronous Conveyor," which is owned by Asyst Technologies, Inc., and is incorporated in its entirety herein. The drive rail 12 includes a drive system, generally designated at 38 in FIG. 1, for propelling a container 2 along the rails 12. The drive system 38 includes a plurality of separate drive assemblies 40. Each drive assembly 40 includes a plurality of drive wheels 42 which frictionally engage the underside of the container 2 to propel the container 2 along the drive rail 12 for a specific zone Z. As shown in FIG. 1, the drive assemblies 40 are located along the rail such that the separation between the outermost drive wheels 42 of adjacent drive assemblies 40 is substantially equal to the spacing between the drive wheels 42 of the individual drive assembly 40. The drive wheels 42 project upwardly from the drive rail housing such that it is the drive wheels 42 of the rail 12 which directly support the transport container 2. The wheels 42 are preferably mounted at approximately the same height to minimize tipping or rocking of the container 2 as it is moved along the rails 12. It is also known within the art to individually mount a passive wheel 43 between each drive wheel 42 (as shown in FIG. 1).

It would be advantageous to provide a conveyor system that improves the performance of a conventional conveyor and reduces the costs of AMHS conveyor systems. The present invention provides such a conveyor.

SUMMARY

The present invention defines various embodiments for conveyor systems, systems for moving/transporting containers used to hold semiconductor wafers or product, and associated methods for operating the transport. The embodiments define example conveyor belts, modules, and surfaces used on the conveyor belts, which enable the efficient transport of containers from one location to another in a fabrication facility. The transport can move containers to and from different processing tools, stocking systems, storage, loaders, etc. The efficient transport of containers is enabled by the various embodiments, and examples provided wherein, but these examples should not limit the scope as is broadly defined in the claims.

In one example embodiment, a conveyor and conveyor system is defined for moving a container used to hold semiconductor wafers. The conveyor includes a first belt having a first support surface for movably supporting the container and a second belt having a second support surface for movably supporting the container. The first belt and the second belt each have a raised guide. The conveyor further includes a drive assembly for moving at least the first belt and causing the container to move over the first and second belts when placed on the first and second support surfaces.

Other embodiments are also presented, as described and illustrated in the drawings filed with this present application.

DETAILED DESCRIPTION

Figure 2A:
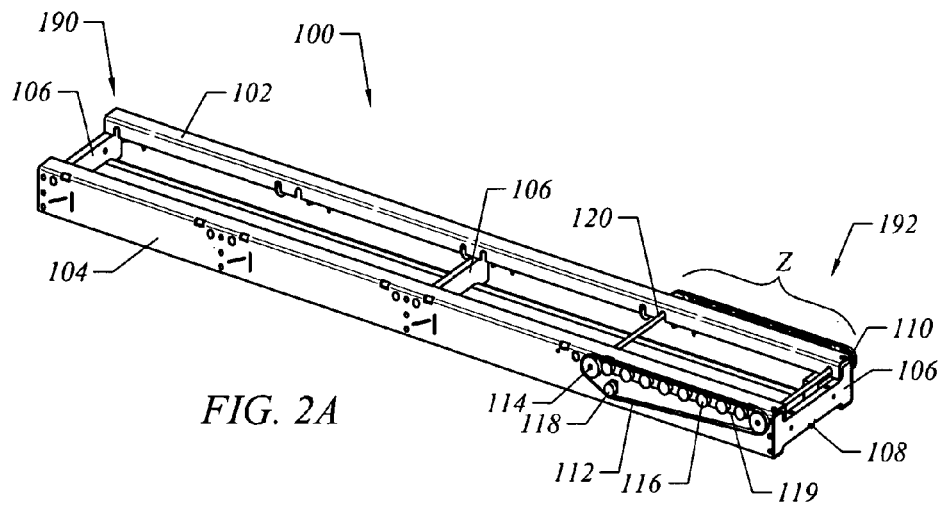
FIGS. 2A-2B provide perspective views of an embodiment of a material handling system according to the present invention, and an enlarged perspective view of a section of the material handling system.

FIG. 2A illustrates a conveyor system 100. The conveyor system 100 is shown, for exemplary purposes only, with only one zone, zone Z, having a drive system 130 installed. The conveyor 100 includes, among other things, a beam 102, a beam 104 spaced apart from the beam 102, and multiple cross-tie plates 106 securing the two beams 102 and 104 together at several locations. A cross-tie plate 106 is secured to the beams 102 and 104 at each of the ends 190 and 192 of the conveyor 100, and an additional cross-tie plate 106 is secured to the two beams 102 and 104 in the middle of the conveyor 100. A cross-tie plate 106 may be secured to the beams 102 and 104 at other locations.

The beams 102 and 104 form the two sides of the conveyor assembly 100 and, in a preferred embodiment, are made from folded sheet metal. The sheet metal structure of the beams 102 and 104 is an improvement over other conventional conveyor structures. Other types of structures (e.g., machined extrusion, machined bar stock, machined plate) may have several drawbacks. For example, other structures may twist during the machining or extruding process. Extrusion inherently produces material that will twist as it is forced through the die, and it then has to be corrected as much as possible. Machining processes relieve area stresses in the metal causing stress imbalances that warp the material. These fabrication problems can cause the final conveyor assembly to bow or twist in a way that causes alignment problems. In addition, other structures may be expensive because of the machining time required. And other structures may be heavy because it is not convenient or cost effective to remove all of the material (with a machining process) that is not needed for rigidity.

Figure 2B:
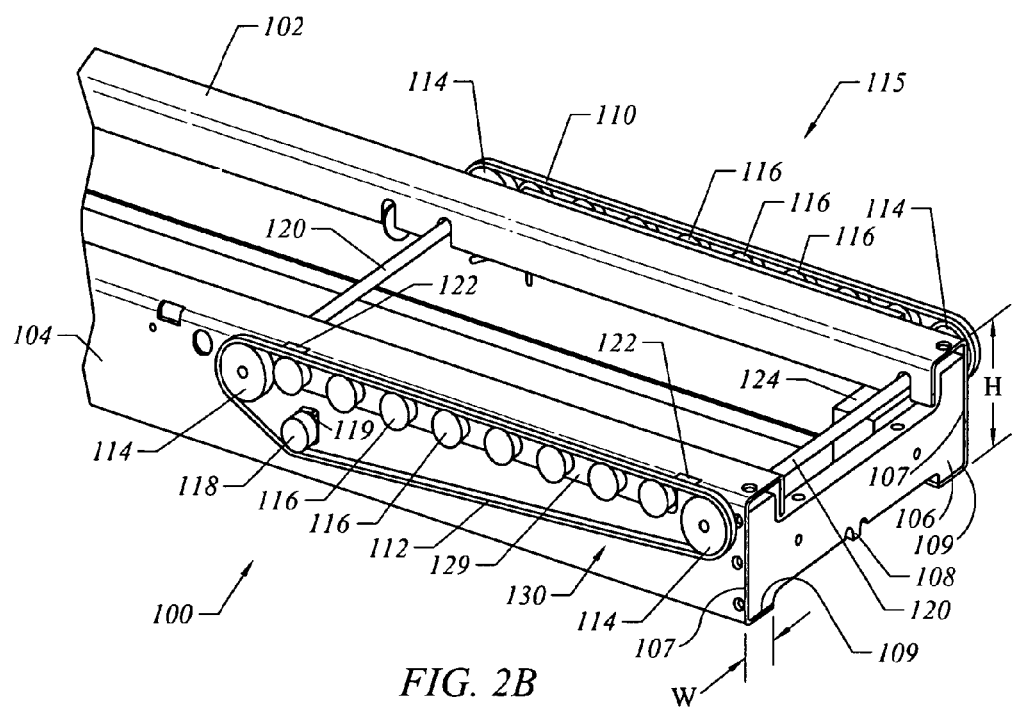

FIG. 2B illustrates that each cross-tie plate 106 is attached to two walls of each beam 102 and 104—the beam's bottom wall 109 and the beam's side wall 107. By attaching each cross-tie plate 106 to two separate walls of each beam, the cross tie plate 106 provides torsional strength and a precision reference structure for the beams 102 and 104. FIG. 2B illustrates that the cross-tie plate 106 is flush with the end of the beams 102 and 104. The cross-tie plate 106 may also extend outward slightly from the end of the sheet metal beams 102 and 104. In this case, a second conveyor section may attach to the cross-tie plate 106 and form an aligned, adjacent conveyor to the conveyor 100.

The folded sheet metal structure has several advantages. The substantially "C"-shaped cross section (see FIGS. 3-4) beams 102 and 104 have a side wall 107 with a height H and a bottom wall 109 with a width W. A side wall 107 that is longer than the bottom wall 109 provides high rigidity for vertically deflecting loads. In addition, the uniform cross section of the beams 102 and 104 provides the best weight to strength ratio. Each bend in the sheet metal beams 102 and 104 is along the longitudinal axis of the beams (e.g., along the length of the conveyor system 100). These bends in the sheet metal naturally form a straight line and eliminate bowing and twisting. The straightness of each beam 102 and 104 is assured using a simple and inexpensive process.

FIG. 2B provides a more detailed view of the zone Z of the conveyor 100. In this embodiment, the drive assembly 130 includes a pair of drive wheels 114, a cartridge 129 of passive wheels 116, a belt tensioning idler 118 and a drive motor 124. The belt tensioning idler 118 may be adjusted until adequate belt tension is achieved.

FIG. 2B illustrates that the belt 112 travels around each drive wheel 114, the passive wheels 116 and the belt tensioning idler 118. The spacing between each passive wheel 116, and the spacing between each drive wheel 114 and an adjacent passive wheel 116 may vary. The diameter of the passive wheels 116 is smaller than the diameter of the drive wheels 114. The passive wheels 116 are pre-mounted to the cartridge 129. The cartridge 129 is mounted to the beam such that the center 117 of each passive wheel 116 is located at a higher elevation on the beam than the center 115 of a drive wheel 114 (see FIG. 10). Thus, the belt 112 is substantially horizontal as it travels across the drive wheels 114 and passive wheels 116.

In a preferred embodiment, the passive wheels 116 are rotatably mounted to the cartridge 129, which is mounted to the beam 104. Each passive wheel 116 may also be individually mounted to the beam 104. The cartridge 129, however, eliminates the need to individually mount each passive wheel 116 to the beam 104. The cartridge 129 also eliminates shafts passing between the beams 102 and 104 for connecting passive wheels 116. As shown in FIG. 2B, the cartridge 129 includes eight passive wheels 116. It is within the scope of the present invention for the cartridge 129 to include any number of passive wheels 116.

The passive wheels 116 provides several advantages over a conventional conveyor system. One advantage is that the passive wheels 116 improve the smoothness of FOUP travel along the conveyor system 100 because the passive wheels minimize the gap between wheels that the FOUP's bottom plate must travel over. The passive wheels 116 make the drive assembly 130 a simpler mechanism than requiring every wheel to be a drive wheel. Often, drive assemblies used in a conventional conveyor comprises individually driven wheels for both contacting and driving the container along the conveyor.

Figure 1:
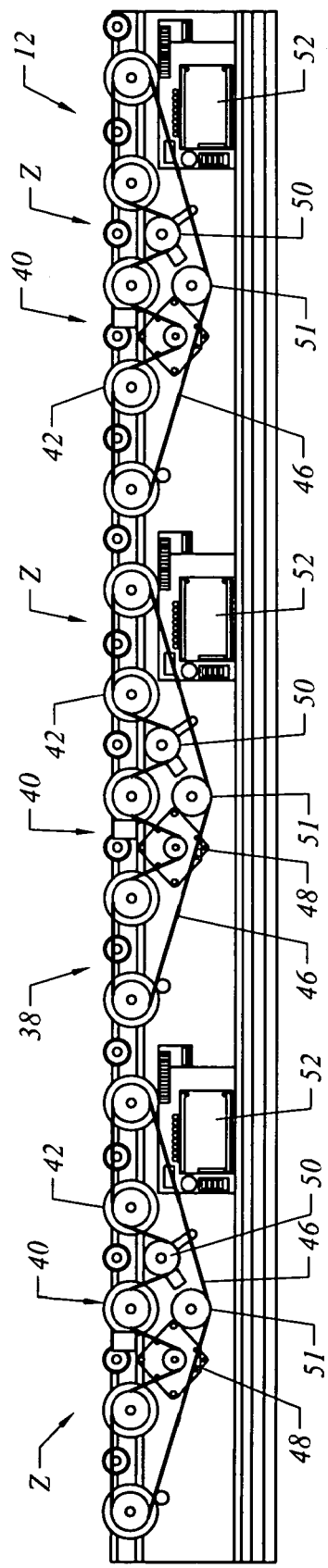
FIG. 1 provides a side elevation view of a conveyor, according to the prior art.

The larger the spacing between passive wheels 116, the rougher the container movement along the conveyor 100. The variations in the FOUP's bottom surface often have greater excursions from the plane formed by the top surface of the passive and drive wheels as the gap between wheels increases. In FIG. 1, when the FOUP's front edge contacts the next drive wheel 42, there is a shock as these surface non-planarities abruptly hit the wheel 42. More passive wheels 43 between the drive wheels 42 as an improvement. But each time a FOUP passes between passive wheels 43, the FOUP's front edge contacts the stationary passive wheel 43 and there is an undesirable scrubbing as the FOUP strikes the wheel and accelerates the rotation of the passive wheel 43. If the drive belt links the drive wheel hubs together, the belt must travel over each wheel hub to assure proper traction. This belt wrap requirement complicates the drive system by adding additional idlers, and the more drive wheels the more complexity.

Figure 3:
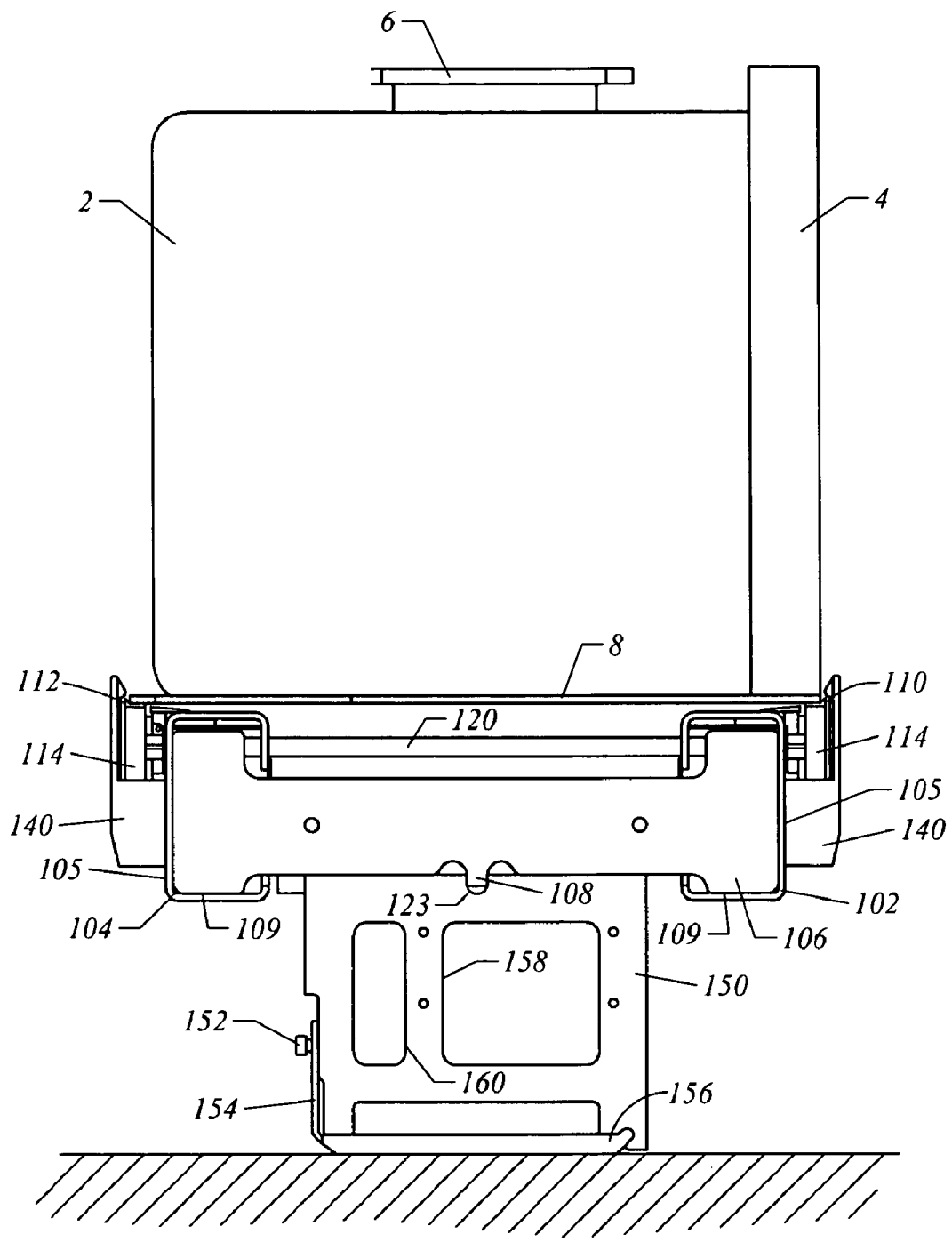
FIG. 3 provides an end view of the FIG. 2B embodiment of the material handling system with a workpiece container seated on the material handling system.

The drive assembly within a conveyor zone, as shown in FIG. 1, requires 35 bearings for each drive assembly. Thus, each zone requires 70 bearings. When a large quantity of conveyor in a fab installation is considered, (thousands of meters of conveyor), the reduction in bearing count while providing superior two sided drive, would be a major improvement. The conveyor 100 reduces the number of bearings and shafts required by a drive assembly 130. FIG. 3 illustrates that a bearing 180 is positioned at each drive wheel drive shaft support 120 and a bearing (not shown) is required at each of the passive wheels 116 (because they are not under any tension load). The idler 118, in one embodiment, also only requires one bearing. Thus, only 22 bearings are required per zone for the two drive assemblies 130.

Each zone Z of the conveyor 100 includes two drive assemblies 130. Each drive assembly 130 provides a simple travel path for the belts 110 and 112 and maintains an appropriate tension within the belts 110 and 112. Each drive assembly 130 also supports and maintains a potion of the belts 110 and 112 raised above beams 102 and 104 for supporting the container 2. The drive assemblies 130 compose a plurality of operational zones Z, with each zone Z including one drive system 138. However, in other embodiments of the invention the zones Z may each include more than one drive assembly 130. The drive speed and direction (forward or reverse) of each zone is independently controlled.

Figure 5:
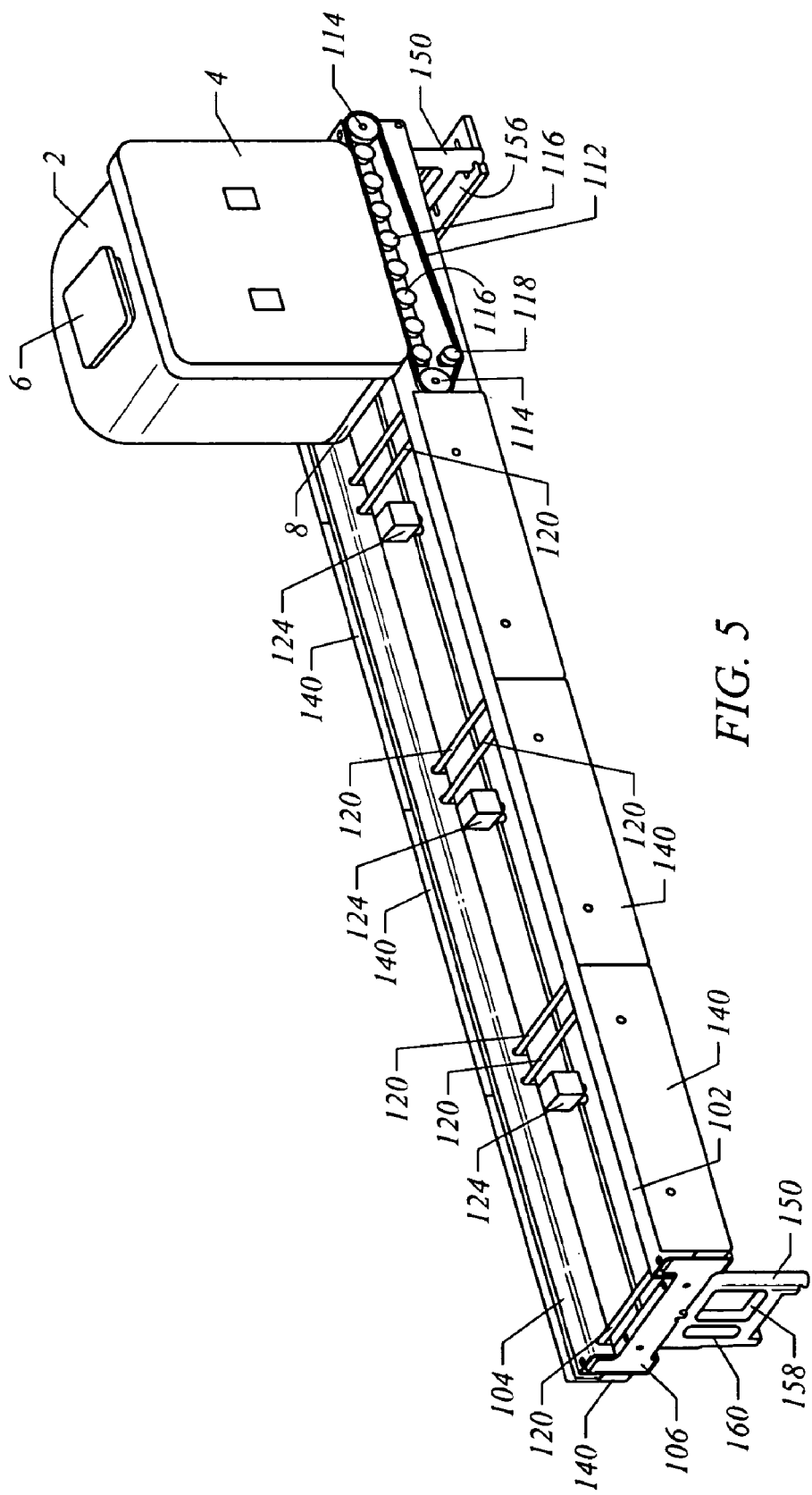
FIG. 5 provides a perspective view of another embodiment of a material handling system with a workpiece container seated on the material handling system.
Figure 6:
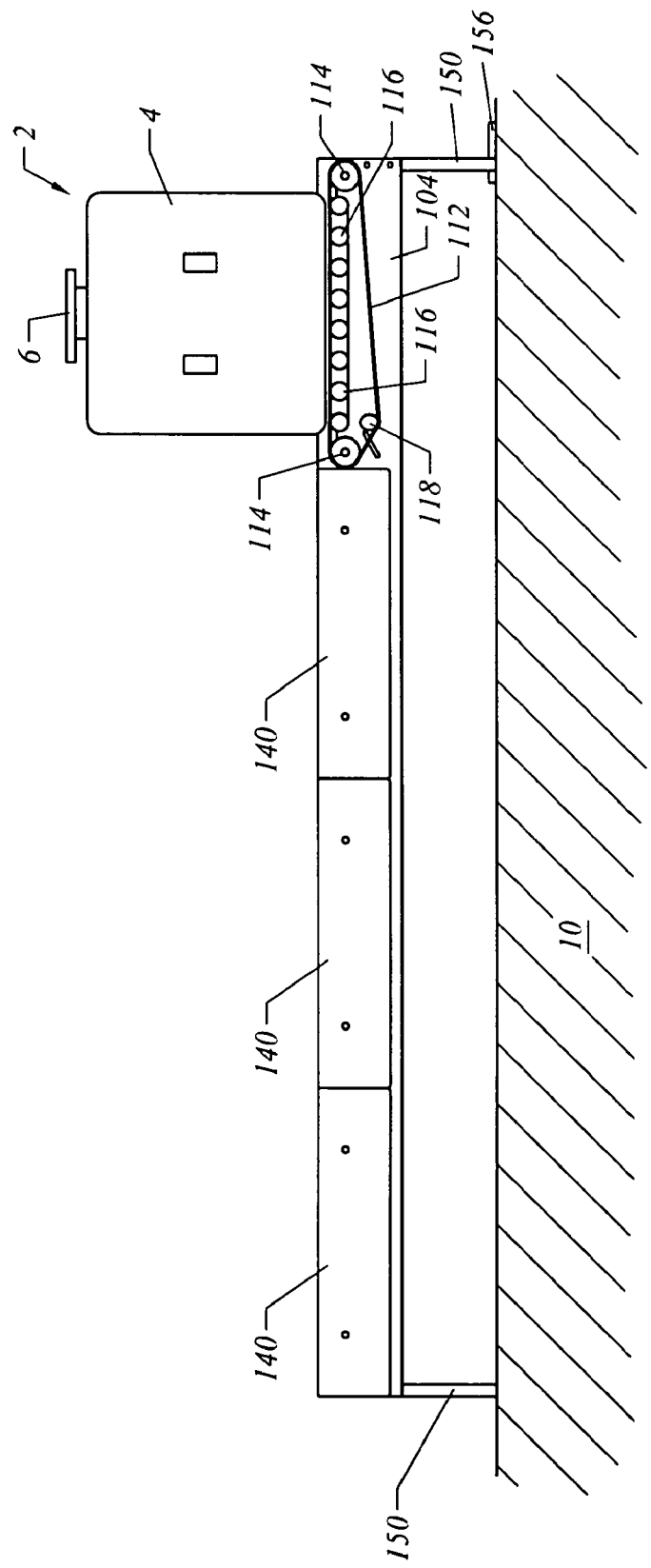
FIG. 6 provides a side view of FIG. 5.

FIG. 2B also illustrates that each zone Z preferably includes at least two sensors 122 for detecting the presence of a container 2 within the zone. In the present invention, the sensors 122 are located near the entrance and exit of the zone Z to detect when the container enters and leaves the zone. The location of the container 2 is used to activate the zones located downstream so that the belts of the downstream zone are active and operating at the same speed as the belts 110 and 112 in the previous zone when the pod reaches the downstream zone. The sensors may also deactivate drive assemblies of the zone the container 2 just left. The time the container 2 takes to travel between the sensors 122 may also be used to monitor the actual speed of the container as the container travels through the zone. The sensors 122 are preferably not spaced so far apart that a container may sit within a zone and not be detected. For example, if the container 2 is traveling on the conveyor 100 as shown in FIGS. 5-6, the sensors 122 are preferably not spaced apart further than the width of the container 2. If, however, the container 2 is traveling on the conveyor 2 face forward or backward (e.g., rotated 90 degrees from that shown in FIGS. 5-6), the sensors are preferably not spaced apart further than the depth of the container 2.

Each zone Z preferably includes one microprocessor or control device (not shown) for controlling operation of the drive assembly 130 in that zone. The control device may be coupled to a control system that controls overall operation of the conveyor. The configuration of the control system is subject to considerable variation within the scope of this invention. For example, the control system may include a computer for controlling operation of the entire conveyor 100, controlling each zone Z. The computer may also monitor the status of the load ports 10 (see FIG. 11) and, when the load ports are filled, stop the approaching transport pods 2 at spaced apart locations upstream from the filled load port to prevent collisions between the pods. The computers of each bay may be stand-alone systems or the computers may be part of a network that includes the control systems for the inter-bay conveyor, the stockers, and other automated components of the manufacturing facility. The central control system of the processing facility may also monitor the processing machines. One example of such a control system is disclosed in U.S. Pat. No. 6,853,876, entitled "Distributed Control System Architecture and Method for a Material Handling System," which is owned by Asyst Technologies, Inc., and is incorporated in its entirety herein.

FIG. 3 illustrates that the belts 110 and 112 support the container 2. In one embodiment, each zone Z of the conveyor 100 includes a drive assembly 138 (see FIG. 10) for driving the belts 110 and 112 and propelling the container 2 along the conveyor 100. FIG. 3 illustrates that a cover 140 mounts to the beams 102 and 104 to protect the drive assemblies 130. The cover 140 also helps retain any particles generated by the drive assembly 130. The covers 140 are optional.

In one embodiment, the conveyor 100 is raised off the fabrication floor by a support 150. The FIG. 3 embodiment illustrates the support 150 mounted to a track 156. In one embodiment, the support 150 may slide along the track 156 for positioning the conveyor 100 within the facility. The track 156 includes a locking clip 154 so that the support 150 may be locked in place with respect to the track 156. FIG. 3 illustrates that the support 150 is held in place by a locking clip screw 152. The support 150 may be locked to the track 156 by other devices known within the art. The support 150 also includes a receptacle 123 that interlocks with the cross-tie key 108; locking the conveyor 100 on the support 150. The conveyor 100 may also be hung from the fabrication facility ceiling, mounted to a facility wall or mounted to any object that will support the conveyor's weight.

In one embodiment, the cross-tie plate 106 includes a cross tie key 108 that fits into a notch 123 in the support 150; allowing for a consistent relationship between the base of the support 150 and the top surface of the conveyor (e.g., the elevation of the belts 110 and 112). The bottom of the support 150 may slide along the track 156, and may be locked into the beveled surfaces of the track 156. In one embodiment, one of the locking surfaces is machined into the conveyor support plate 150 and the locking clip forms the other locking surface. Other locking mechanisms are within the scope of the invention. When a conveyor section is replaced, the locking clip screw is loosened, and the conveyor section, with its support plates, is removed. A new conveyor section is then installed by placing its support plates 150 on the track 156 and then the locking clip screws are tightened. The precision cross-tie plate 106, cross-tie key 108, support plate notch 123 and support plate locks combine to provide a precise method of conveyor alignment that allows for quick conveyor replacement. This system takes advantage of the precise and predictable floor structure of a typical semiconductor fab.

Multiple conveyors may be mounted to the track 156. The support 150 of each conveyor 100 slidably mounts to the track 156. Once the support 150 is placed on the track 156 the conveyor 100 may be slid along the track 156 to its desired position. For example, a conveyor 100 may be moved along the track 156 until its first end 192 is adjacent to the second end 192 of a previously mounted conveyor 100. Mounting multiple conveyors 100 to the same track 156 aligns the ends of the each conveyor 100.

Figure 4:
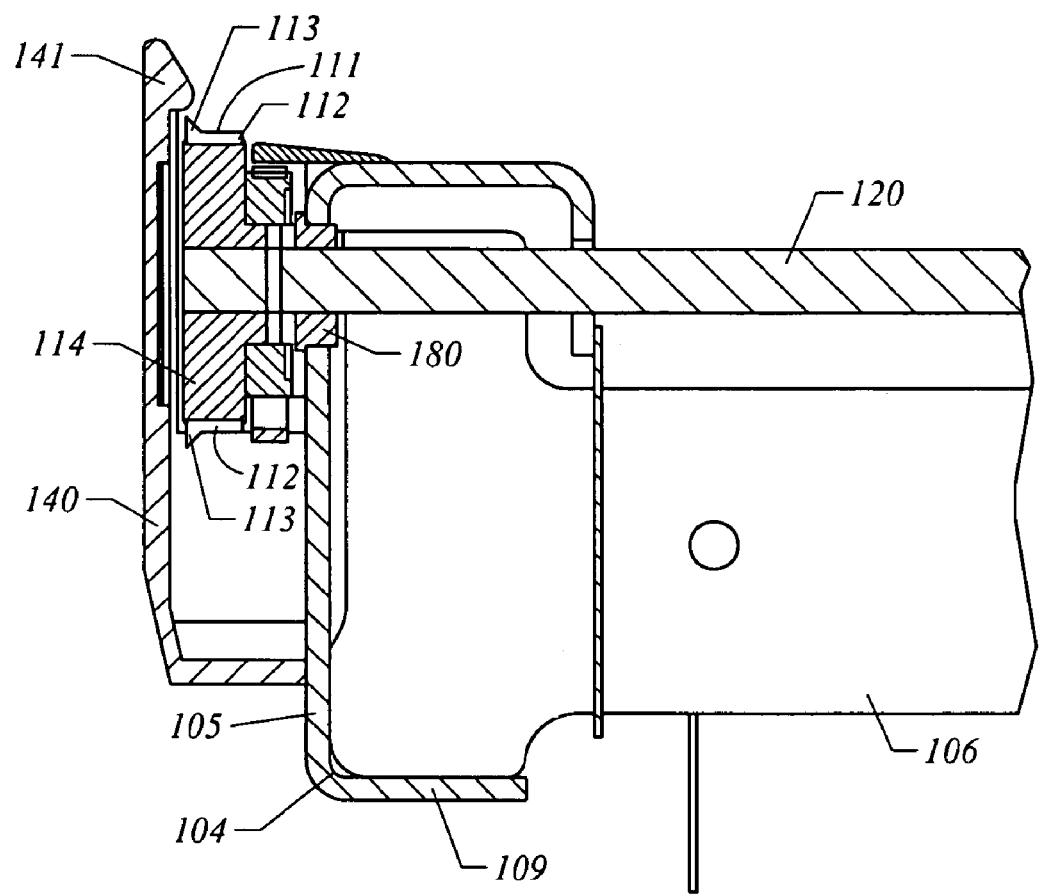
FIG. 4 provides a cross-sectional view of one embodiment of a drive system for the material handling system.

FIG. 4 illustrates a cross-sectional view of a drive wheel 114 and the surrounding components. The drive shaft 120 is supported in the beam 104 by a bearing 180. The drive wheel 114 is mounted to the end of the drive shaft 120. The cover 140 is mounted to the beam 104 and protects the drive wheel 114. The transport belt 112, in this embodiment, includes a lip 113. The lips 113 help maintain the container 2 on the belt 112. The top 141 of the cover 140 also provides an additional lateral restraint on the container. For example, the top 141 of the cover 140 will prevent the container 2 from rotating on the belt 112.

The transport belts 110 and 112 also links drive wheels 114. In a preferred embodiment, the drive wheels 114 (with a smaller amount on the idler) substantially support the transport belt tension force with little or no tension force on the passive wheels 116. The belts 110 and 112 each support the FOP's bottom plate 8. If the belts 110 and 112 have enough tension to support a FOUP (approximately 20 lbs), then the belts 110 and 112 support most of the FOUP's weight and the transition between passive wheels 116 is smother, reducing vibration.

Maintaining belt tension reduces the amount of vibration a container is subjected to compared to the abrupt shock caused by a conventional wheel supported AMHS conveyor. Vibration in the containers is very undesirable because of the sensitive and ultra-clean nature of the environment required for the semiconductor wafers inside of the container. To ensure accurate tracking and stable guidance of the FOUP, the conveyor structure may be intentionally tilted to one side of the conveyor (approximately ½ to 5 degrees), which induces a gravitational bias, assuring that the FOUP tracks against the guiding features of the lower conveyor side.

FIGS. 5-6 illustrate a container 2 moving on the conveyor 100 in a sideways position. The belts 110 and 112 are spaced apart to support the FOUP's bottom plate 8. It is also within the scope of the present invention for the FOUP 2 to travel along the conveyor 100 in other orientations. For example, the FOUP 2 may travel along the conveyor 100 with the FOUP door 4 facing forward (in the direction of travel) or backwards (opposite of the direction of travel). The width of a conventional 300 mm FOUP is not the same as the depth of the FOUP. Thus, the spacing between the belts 110 and 112 must be adjusted according to the orientation of the FOUP on the conveyor.

The bottom surface of a FOUP, in the sensing area, is not standardized between manufacturers. There are parts of the FOUP's bottom surface that has small voids, deep pockets, or sharply angled reflective surfaces. A sensor with a single emitter and detector may have difficulty sensing any one of these singularities.

Figure 7B:
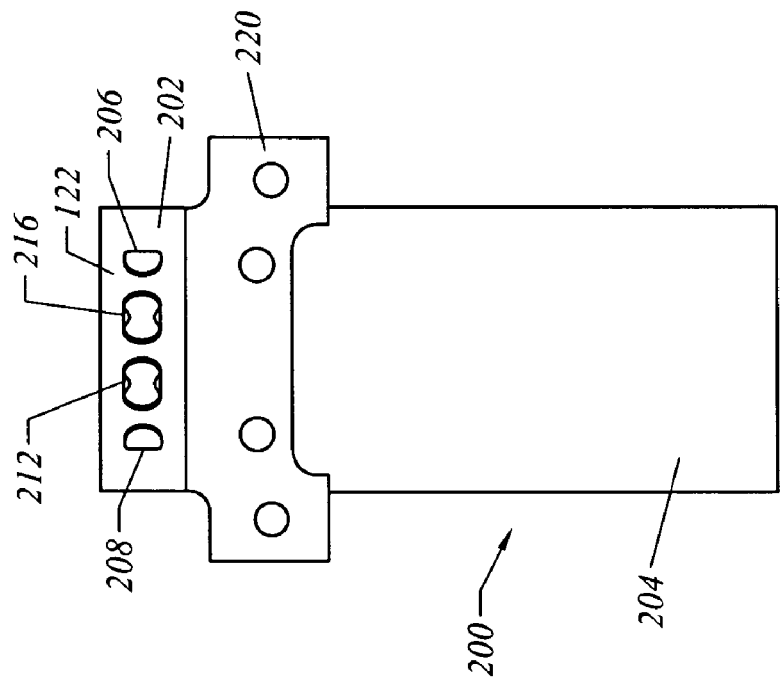
FIG. 7B provides a plan view of the container sensor shown in FIG. 7A.
Figure 7A:
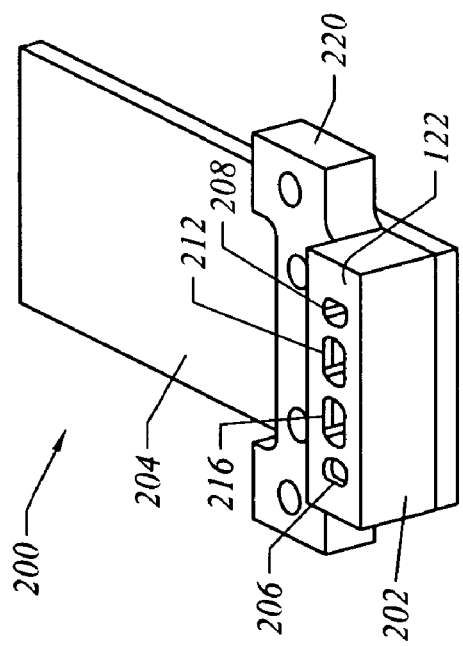
FIG. 7A provides a perspective view of an embodiment of a container sensor for use with the material handling system.
Figure 8:
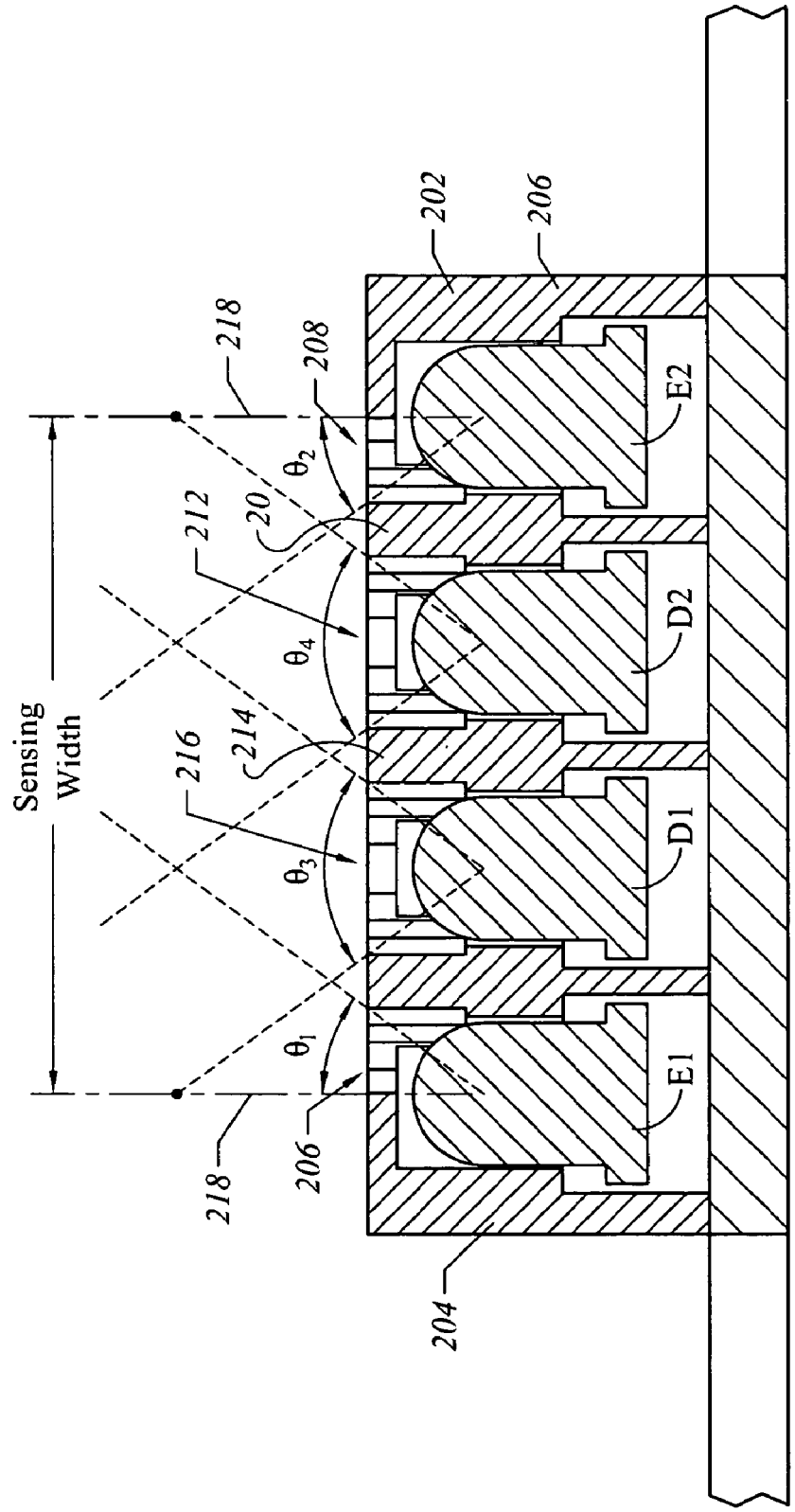
FIG. 8 provides a cross-sectional view of an embodiment of a dual beam sensor for sensing the bottom surface of a workpiece container traveling on the material handling system.

FIGS. 7A-7B illustrate a dual element sensor 122. The sensor 122 includes a sensor housing 202 mounted to a printed circuit board 204. A mounting bracket 220 affixes the sensor 122 to a beam. The housing 202 includes four apertures 206, 208, 212 and 216. FIG. 8 illustrates a cross section of the sensor 122 for sensing the bottom surface of a container on the conveyor. A container 2, oriented as shown in FIG. 4, has a sensing width of 390 mm. This requires two sensors 122 for each 500 mm section of conveyor 100 to assure that the sensor 122 senses the container 2 in any position within the conveyor zone. In one embodiment, the sensor 122 is integrated with existing control circuit boards located in the beams 102 and 104. The sensor apertures 206, 208, 212 and 216 face upwards in order to sense the bottom of the container 2.

An array of emitter/detector pairs could have at least one pair sensing an area that has reasonable sensing characteristics even if the other pair is operating in an undetectable region. FIG. 8 illustrates two sensor pairs—E1/D1 and E2/D2—within the housing 202. More sensor pairs may be used if necessary. The housing 202 includes an aperture 206 over emitter E1 to reduce the emitter's projected beam. Thus, the emitter E1 emits light within the angle $\theta 1$. The housing 202 includes an aperture 208 over emitter E2 to reduce the emitter's projected beam. Thus, the emitter E2 emits light within the angle $\theta 2$. The housing 202 includes an aperture 212 over the detector D2 to allow a full acceptance of incoming light (see angle $\theta 3$). The housing 202 includes an aperture 216 over detector D2 that allows a full acceptance of incoming light (see angle $\theta 4$). In one embodiment, the overall sensing width is approximately 12 mm. The sensing width may vary.

The partially blocked beams emitted by the emitters E1 and E2 creates a distinct illumination edge 218 at either side of the sensor 122. The controlled illumination creates an accurate position at which the leading edge of the FOUP is sensed regardless of the direction of FOUP motion. No light is reflected off of the FOUP's bottom surface until the FOUP front edge crosses the point directly above the center of the emitter, where the emitters have their distinct illumination edge 218. The point at which the FOUP front edge first crosses the emitter's illumination point is within the viewing aperture of its paired detector. If the FOUP were vertically too close to the sensor housing, this illumination point would not be in the apertured view of the detector.

This sensing method provides repeatable sensing that allows for accurate positioning of the FOUP 2 on the conveyor 100. The two pairs of sensors 122 are spread out so that if one pair is positioned at a feature that is difficult to sense the other pair will provide adequate sensing. The FOUP bottom surface may be analyzed for optimum sensor spacing. In a preferred embodiment, both detectors D1 and D2 are logically gated with an "OR" function—either by their immediate sensing circuits or by a microprocessor, microcontroller or digital signal processor that is receiving the signal individually. Either detector receiving an adequate signal will be interpreted as a FOUP sense event for the combined sensor.

Figure 9:
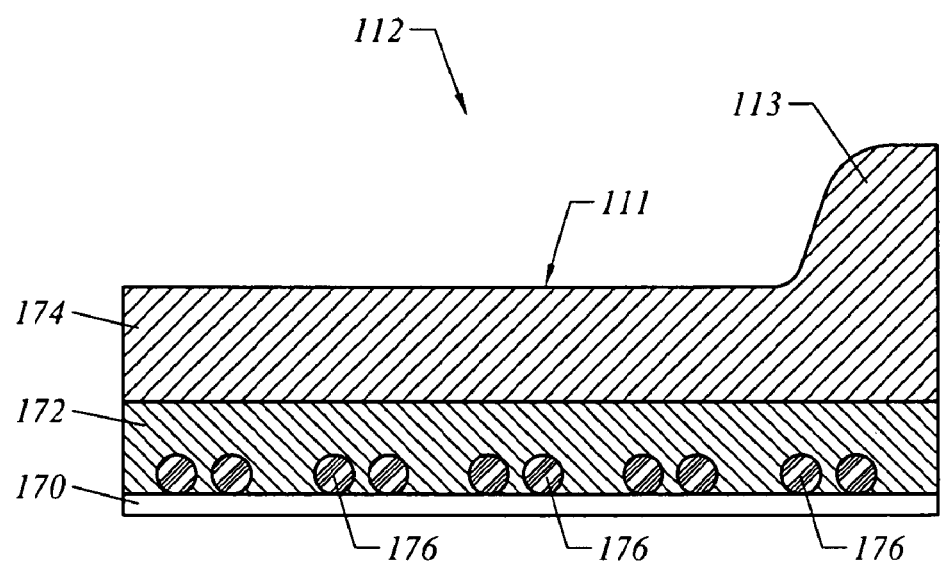
FIG. 9 provides a cross-sectional view of an embodiment of a belt, according to the present invention.

FIG. 9 illustrates the belt 112. In this embodiment, the belt 112 comprises a support surface 111 and a guide or lip 113. The FOUP's bottom plate 8 rests on the support surface 111 as the belt 112 propels the FOUP down the conveyor 100. The support surface 111 is shown as a planar surface. However, it may be desirable for the support surface 111 to comprise a pebbled or ribbed surface.

The belt 112 comprises two layers of material. In a preferred embodiment, the first layer 172 comprises Shore 80A polyurethane and the second layer 174 comprises Shore 70A polyurethane. The first layer 172 includes S&Z wound Kevlar strands 176 to increase the rigidity of the first layer 172. The two different materials creates a belt 112 having rigid first layer 172 and a softer second layer 174. The softer second layer 174 acts as a built-in suspension system that helps the FOUP ride down the conveyor smoother than if the support surface 111 comprised a more rigid material. The belt 112 also preferably includes an electrostatic discharge additive. The belt 112 may comprise other materials.

Figure 10:
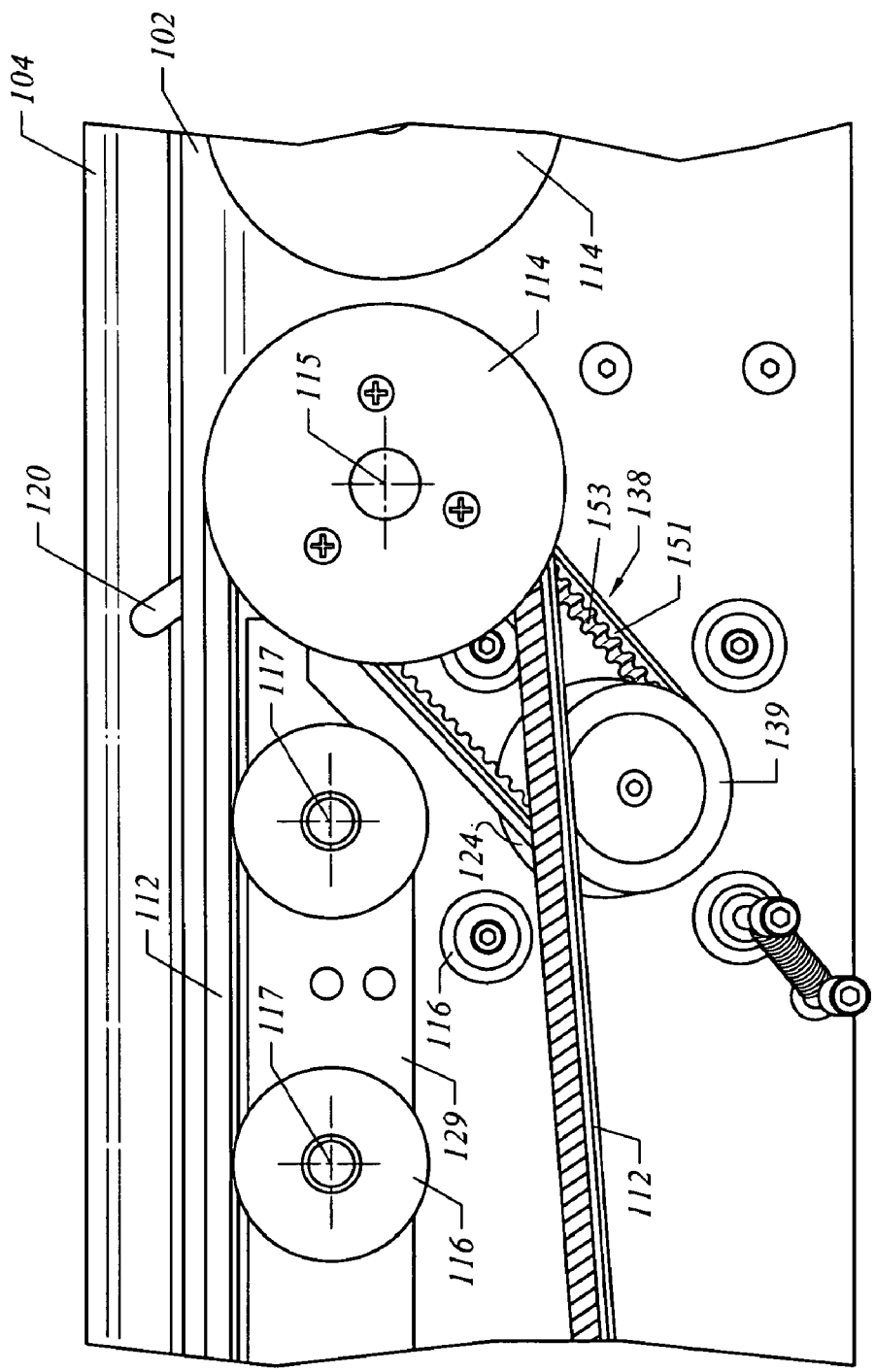
FIG. 10 provides a side elevation view of an embodiment of a drive system, according to the present invention.

FIG. 10 illustrates one embodiment of a drive system 138. The drive system 138 includes, among other things, a drive motor 124 coupled to a drive wheel 114. The output shaft of the drive motor 124 is coupled to a wheel 139. The wheel 139 is coupled to the drive wheel 114 by a timing belt 151. In this embodiment, the timing belt 151 has teeth 153 to form a rack and pinion arrangement with both the wheel 139 and the drive wheel 114. Other mechanisms known within the art may be used to rotate the drive wheel 114. The drive system 138 rotates the belts 110 and 112 within each section or zone of the conveyor 100. The drive motor 124 may rotate in clockwise and counterclockwise directions of rotation, allowing the belts 110 and 112 to move a transport container 2 forward or backward along the conveyor 100.

The drive systems 138 of adjacent operational zones are preferably accelerated and decelerated at the same rate such that at the time of transfer, the speed imposed on the transport container 8 by the adjacent drive assemblies 130 is synchronized at the time of transfer between the zones. When a container 2 is being propelled along the conveyor 100, it is possible that only the operational zones includes the zone directly below a container 2 and one or more zones adjacent the container 2 are active at any time. By only activating specific zones in anticipation of a container entering the zone, the power consumption of the conveyor system is reduced and extends the operational life of the drive assemblies 130. Containers moving on the conveyor 100 are preferably separated by at least one empty zone, in which there is no container 2, to provide a buffer between containers 2 and protecting the containers against inadvertently bumping into one another.

The spacing between the containers is preferably increased as the velocity of the container increases to provide a safe stopping distance at all times. When containers are not in motion, the containers may occupy adjacent drive zones on the conveyor.

The drive system 138 of the illustrated embodiment provides a clean, efficient drive mechanism for moving the container 2 along the conveyor 100 in a precise controlled manner. However, it is to be understood that other types of drive systems may be used in other embodiments of the invention. Using the independent drive assemblies 130 of this invention, the movement of several containers may be independently controlled. It is within the scope of the invention to operate multiple drive assemblies 130 with a single drive motor 124. Each drive assembly 130 may, for example, include a clutch mechanism that could couple each drive assembly 130 to the drive motor 124. FIG. 10 also illustrates a spring tension mechanism 195.

Figure 11:
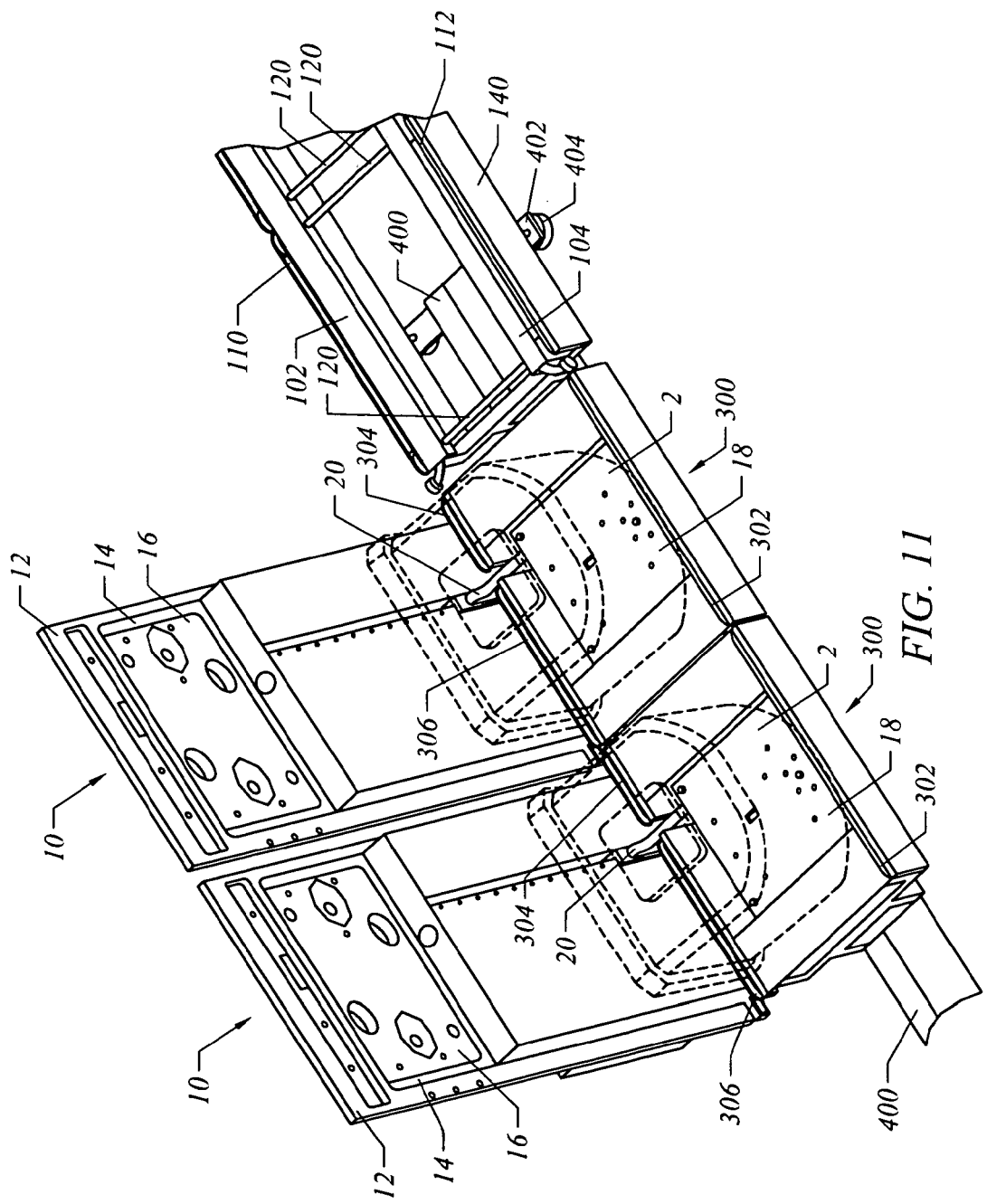
FIG. 11 provides a perspective view of an embodiment of a conveyor system in conjunction with a load port.

FIG. 11 illustrates the conveyor 100 in conjunction with a pair of load ports 10. Each load port 10 includes a plate 12 with an aperture 14, a port door 16 and vertically adjustable FOUP advance plate 18. One such load port 10 is disclosed in U.S. application Ser. No. 11/064,880, which is assigned to Asyst Technologies, Inc. and is incorporated in its entirety herein. The conveyor 100 moves a FOUP 2 adjacent the load port 10.

The conveyor section 300 located in front of each load port 10 accommodates the container advance plate 18. Each conveyor section 300 includes a belt 302 for supporting the back end of the FOUP 2 and two belts 304 and 306 for supporting the front end of the FOUP 2. The beam supporting the two belts 304 and 306 are split to accommodate the arm 20 that moves the FOUP advance plate 18 up and down. Each section of beam may include a drive assembly similar to the drive assembly 130 in each zone Z of the conveyor 100.

The conveyor 100 and conveyor sections 300 are shown mounted to a rail or track 400. The track 400 provides a common mounting structure for the conveyor sections 300 and the conveyor 100. The track 400 aligns the z-axis and y-axis of the conveyor sections 300 with the conveyor 100, yet allows the conveyors to move along the x-axis. The rail 400, in this embodiment, is mounted to vibration mounts 404.

It should be appreciate that the above described mechanisms and methods for supporting and transferring containers and/or conveyor belts are for explanatory purposes only and that the invention is not limited thereby. It should be apparent to those skilled in the art that certain advantages of the within system have been achieved. It should also be appreciate that various modifications, adaptations and alternative embodiments thereof may be made within the scope and spirit of the present invention.

The invention claimed is:

1. A conveyor configured to move a container, the conveyor comprising:
two or more modular conveyor sections, wherein each modular conveyor section defines a zone of the conveyor, and wherein each modular conveyor section comprises:
a first belt comprising a first support surface configured to support the container;
a second belt comprising a second support surface configured to support the container;
the first belt and the second belt each comprising a raised guide; and
a drive assembly configured to move at least the first belt and configured to cause the container to move in a conveying direction over the first and second belts when placed on the first and the second support surfaces; and
a track to which each of the two or more modular conveyor sections is mounted, wherein the track aligns each of the two or more modular conveyor sections with each other in the conveying direction.

2. The conveyor of claim 1, further comprising:
a second drive assembly configured to move the second belt.

3. The conveyor of claim 1, wherein the first belt and the second belt each comprises a continuous belt.

4. The conveyor of claim 1, further comprising at least one sensor configured to detect the presence of the container on the conveyor.

5. The conveyor of claim 1, wherein the first belt comprises an electrostatic discharge element.

6. The conveyor of claim 1, wherein said the drive assembly is configured to be coupled to a drive system.

7. A system configured to transport a container in a semiconductor fabrication facility, the container comprising a first contact surface and a second contact surface, the system comprising:
a conveyor comprising:
two or more modular conveyor sections, wherein each modular conveyor section defines a zone of the conveyor, and wherein each modular conveyor section comprises:
a first belt comprising a first support surface configured to support the container by the first contact surface;
a second belt comprising a second support surface configured to support the container by the second contact surface, the second belt spaced apart from the first belt;
the first belt and the second belt each comprising a raised guide; and
a motor configured to drive one or more of the first belt and the second belt in a conveying direction, wherein each of the first and the second belts is located between a pair of end wheels of the motor, and wherein each of the first and the second belts has at least one support wheel between the pair of end wheels configured to provide support; and
a track to which each of the two or more modular conveyor sections is mounted, wherein the track aligns each of the two or more modular conveyor sections with each other in the conveying direction.

8. The system of claim 7, wherein a planar material stored in the container is horizontally oriented while the container is seated on the conveyor.

9. The system of claim 7, wherein a planar material stored in the container is vertically oriented while the container is seated on the conveyor.

10. The system of claim 7, wherein the first support surface of the first belt comprises one or more of a flat surface, a ribbed surface, a pebbled surface.

11. The system of claim 7, wherein the ribbed surface is comprises a discontinuous surface.

12. The system of claim 7, wherein the motor is coupled to a first drive assembly of the first belt.

13. The system of claim 7, wherein the conveyor has one or more loading and unloading positions, associated with the conveyor, are configured to enable movement of the container to and from one or more of stocking systems, load ports, storage locations, transport systems, and process equipment.

14. The system of claim 7, wherein the zone comprises a first zone located downstream from a second zone and a third zone, and wherein the first zone is configured to be activated during transportation of the container, such that activation of the first zone causes the second zone and the third zone to operate at about a same speed.

15. The system of claim 12, wherein the first drive assembly comprises a drive wheel and a set of passive wheels.

16. The system of claim 15, wherein the set of passive wheels are configured to mount to a cartridge.

\* \* \* \* \*

UNITED STATES PATENT AND TRADEMARK OFFICE
CERTIFICATE OF CORRECTION

PATENT NO. : 7,784,606 B2 Page 1 of 1
APPLICATION NO. : 12/331395
DATED : August 31, 2010
INVENTOR(S) : Anthony C. Bonora, Michael Krolak and Roger G. Hine It is certified that error appears in the above-identified patent and that said Letters Patent is hereby corrected as shown below:

Title Page, In Column 1, after "Prior Publication Data US 2010/0051422 A1 Mar. 4, 2010" insert the following:

--This Application claims priority under 35 USC 120 to parent application Ser. No. 11/484,218, entitled "Belt Conveyor for Use with Semiconductor Containers", and filed on Jul. 10, 2006, and is herein incorporated by reference. The parent application, in turn, claims priority under 35 U.S.C. §119(e) to U.S. Provisional Patent Application No. 60/698,124, entitled "Belt Conveyor for use with Semiconductor Conveyors," which was filed with the U.S. Patent & Trademark office on Jul. 11, 2005, and which is incorporated in its entirety by reference herein.--

Col. 10, Line 18, In Claim 6, after "wherein" delete "said".

Col. 10, Line 56, In Claim 10, after "surface" insert --and--.

Col. 10, Line 59, In Claim 11, after "surface" delete "is".

Col. 10, Line 63, In Claim 13, after "wherein" delete "the conveyor has".

Signed and Sealed this

Twenty-third Day of November, 2010

David J. Kappos
*Director of the United States Patent and Trademark Office*